(12) United States Patent
Honda

(10) Patent No.: US 6,639,246 B2
(45) Date of Patent: Oct. 28, 2003

(54) SEMICONDUCTOR DEVICE

(75) Inventor: Tatsuya Honda, Atsugi (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 10/199,174

(22) Filed: Jul. 22, 2002

(65) Prior Publication Data

US 2003/0020065 A1 Jan. 30, 2003

(30) Foreign Application Priority Data

Jul. 27, 2001 (JP) .......................... 2001-228222

(51) Int. Cl.⁷ .................. H01L 29/04; H01L 27/01
(52) U.S. Cl. ................. 257/72; 257/59; 257/66; 257/69; 257/74; 257/347
(58) Field of Search .................. 257/27.1, 29.117, 257/29.273, 72, 347, 368, 359, 59, 66, 69, 74, 350, 351, 352; 349/42, 43, 41

(56) References Cited

U.S. PATENT DOCUMENTS

| | | |
|---|---|---|
| 4,959,697 A | 9/1990 | Shier et al. |
| 5,548,143 A | 8/1996 | Lee |
| 5,644,147 A | 7/1997 | Yamazaki et al. |
| 5,807,772 A | 9/1998 | Takemura |
| 5,818,070 A | 10/1998 | Yamazaki et al. |
| 5,917,221 A | 6/1999 | Takemura |
| 6,146,927 A * | 11/2000 | Yamanaka ............... 438/149 |
| 6,320,202 B1 * | 11/2001 | Banerjee et al. ........... 257/66 |
| 6,326,642 B1 | 12/2001 | Yamazaki et al. |
| 6,340,830 B1 | 1/2002 | Takemura |

FOREIGN PATENT DOCUMENTS

JP 2737780 4/1998

* cited by examiner

*Primary Examiner*—Minh Loan Tran
*Assistant Examiner*—Tan Tran
(74) *Attorney, Agent, or Firm*—Eric J. Robinson; Robinson Intellectual Property Law Office, P.C.

(57) ABSTRACT

There is a problem in that a possibility of a carrier being caused on an interface between a semiconductor layer and an insulating film is high, and the carrier is injected into the insulating film and the interface between the insulating film and the semiconductor layer, so that a threshold rises. A semiconductor device including: a first gate electrode formed on an insulating surface; a first gate insulating film formed on the first gate electrode; a first semiconductor layer formed on the first gate insulating film; a second semiconductor layer formed on the first semiconductor layer; a third semiconductor layer formed on the second semiconductor layer; a second gate insulating film formed on the third semiconductor layer; and a second gate electrode formed on the second gate insulating film, wherein a channel region in which an intrinsic second semiconductor layer is formed is included between the first semiconductor layer and the third semiconductor layer in each of which an impurity element for imparting one conductivity type is added at the concentration of $1 \times 10^{15}$ to $1 \times 10^{17}/\mathrm{cm}^3$.

17 Claims, 15 Drawing Sheets

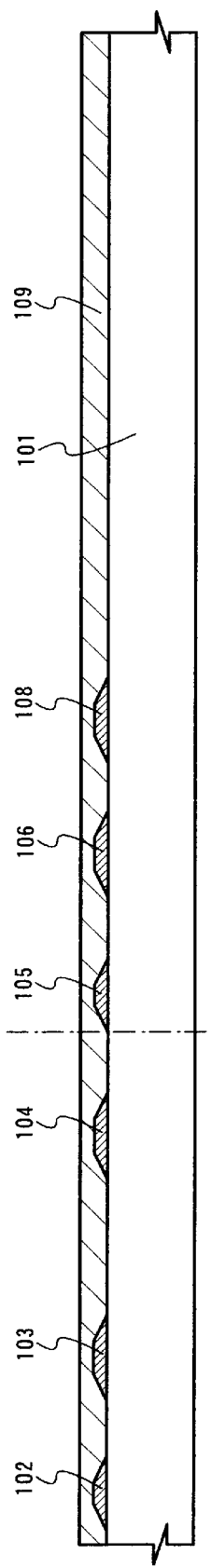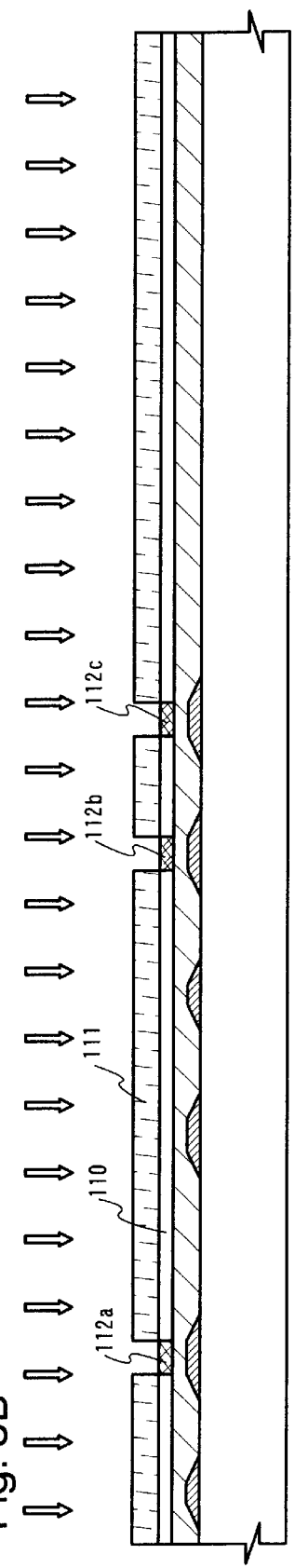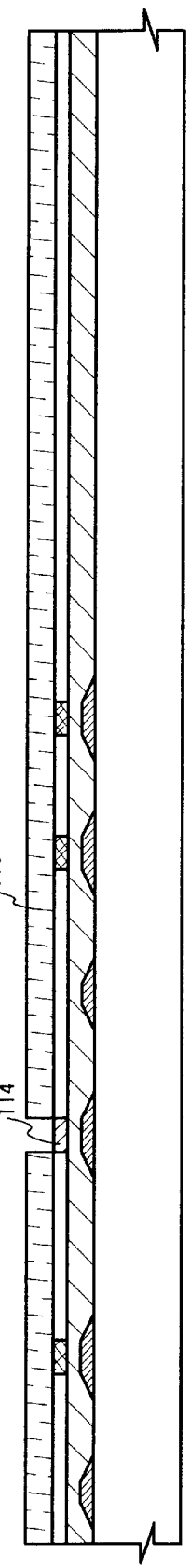

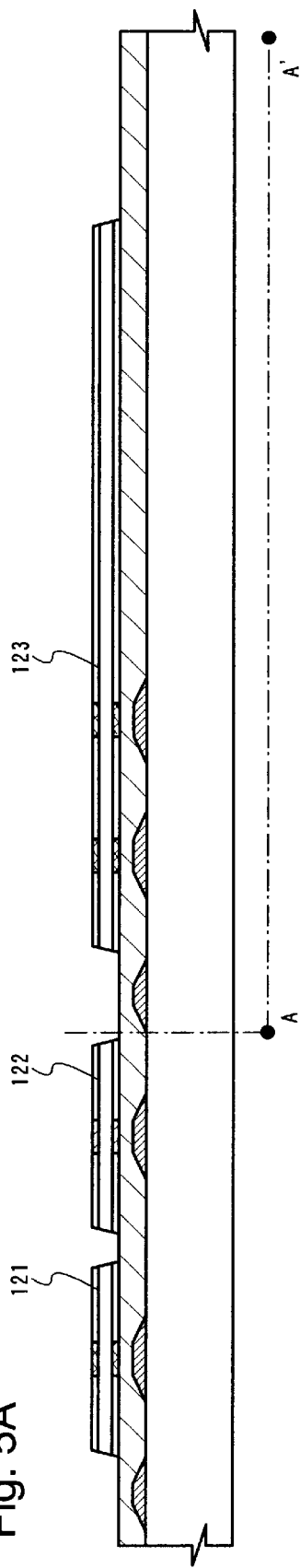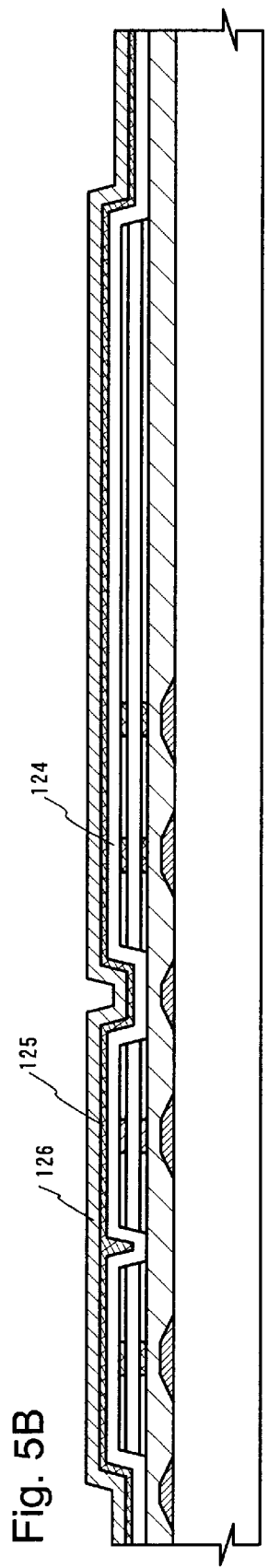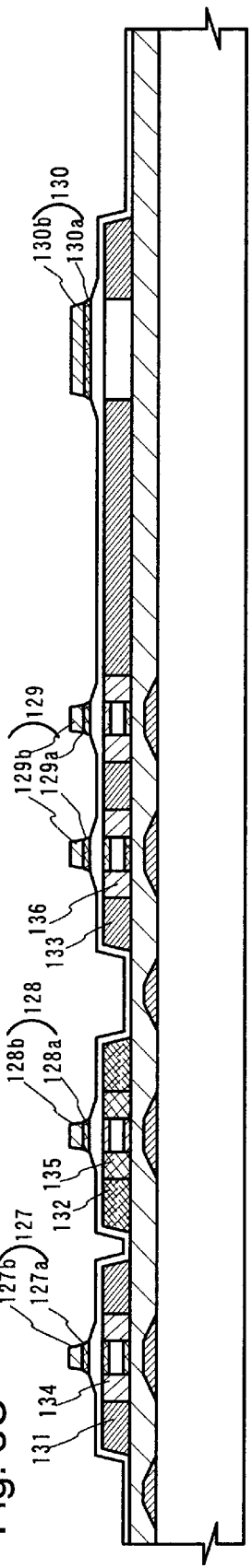

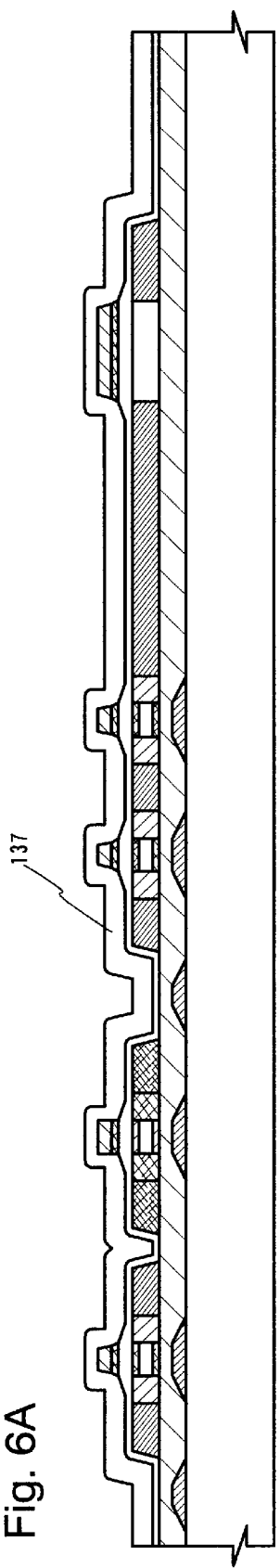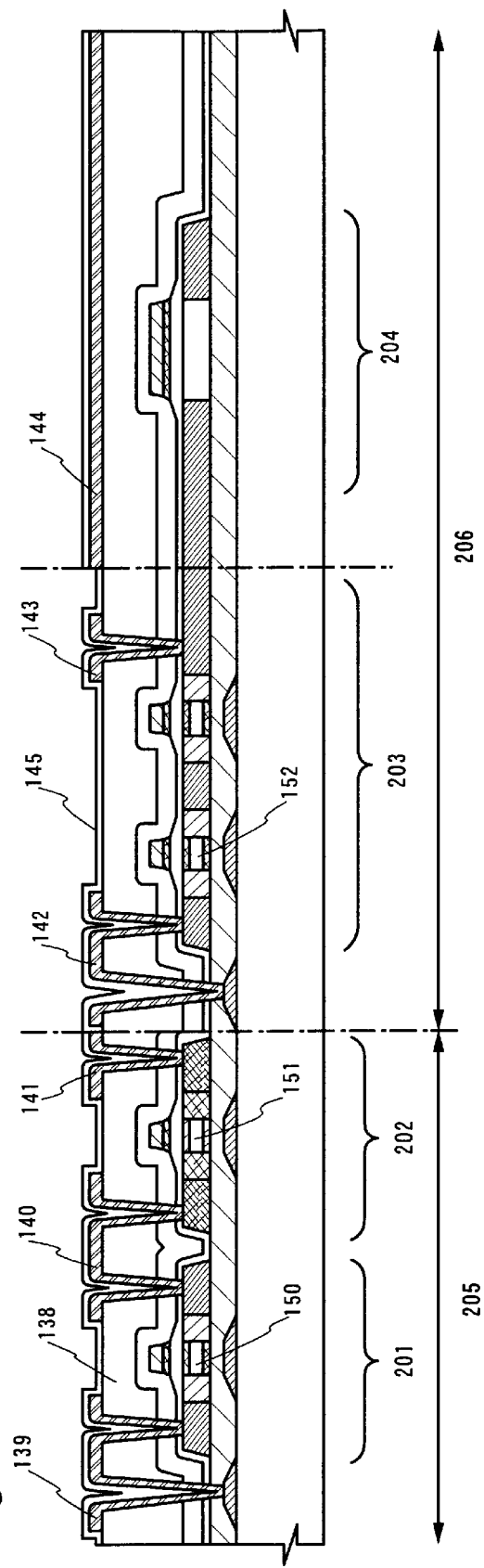
Fig. 6A
Fig. 6B

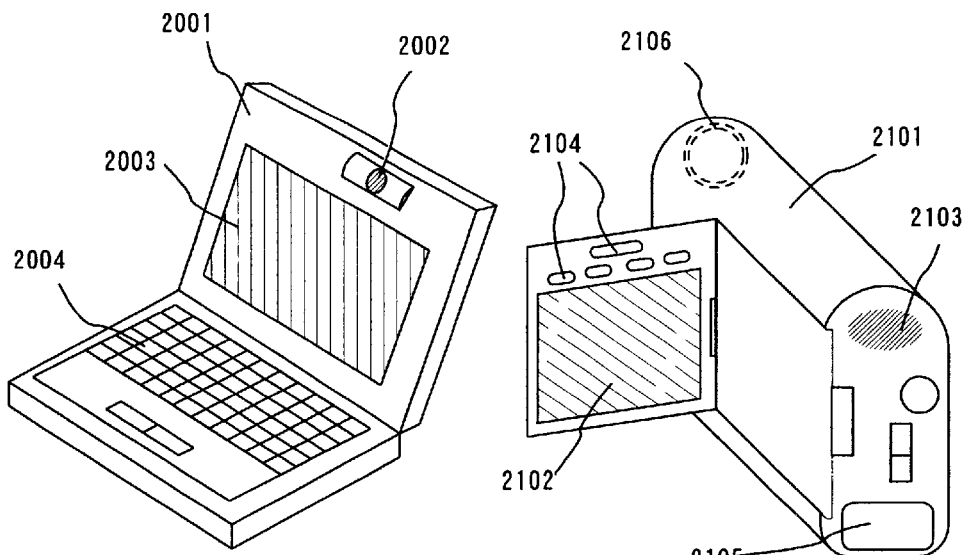
Fig. 11A
Fig. 11B
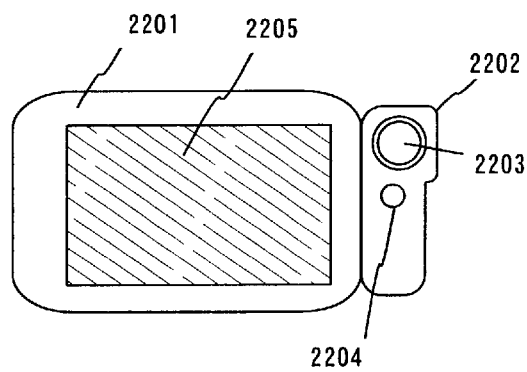
Fig. 11C
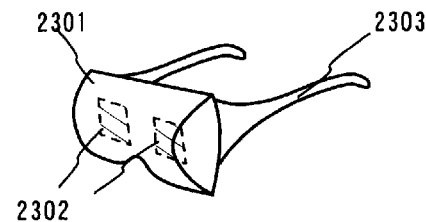
Fig. 11D
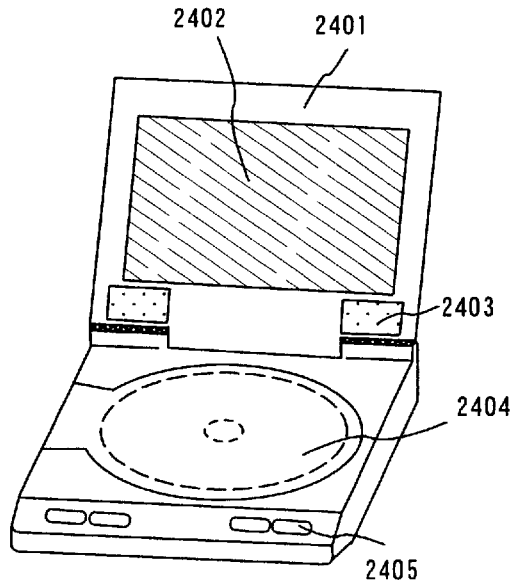
Fig. 11E
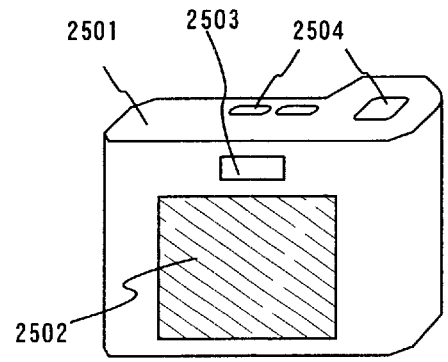
Fig. 11F

SEMICONDUCTOR DEVICE

BACKGROUND OF THE INVENTION

1. Field of the Invention

The present invention relates to a semiconductor device using a thin film transistor (hereinafter referred to as TFT) employing a semiconductor film formed on a substrate. Note that in this specification, the term "semiconductor device" indicates all the devices functioning by utilizing their semiconductor characteristics. Further, the semiconductor device manufactured in accordance with the present invention includes a display device represented by a liquid crystal display device in which a TFT is built-in and a semiconductor integrated circuit (a microprocessor, a signal processing circuit, a high frequency circuit, and the like) under the category.

2. Description of the Related Art

Development of information communication technologies has progressed and a display device as means for receiving information has been shifting from a CRT (cathode ray tube) to a flat panel display. This is because the CRT, which has been conventionally utilized for television display to provide various information, cannot sufficiently cope with the recent increased volume of information (for example, higher quality picture). Further, there also arises a problem in that it cannot sufficiently cope with high resolution for displaying a high quality picture, nor with enlargement of the screen. For example, when enlargement of the screen is to be advanced, the weight of the CRT itself becomes so great that it cannot be easily carried. Further, even in the same screen dimensions, when the resolution is made high, the luminance is degraded and the depth has to be extended. Therefore, installment of the device at home is rather restricted.

Then, as a candidate for a display device which can meet the demand for higher resolution and enlargement of the screen, a flat panel display characterized by being small in size, light-weight, and allowing saving of space is attracting attention. Particularly, a liquid crystal display device has been focused on and research development has progressed on a large scale.

In order to cope with the increased volume of information, the device must be able to write data in a short period of time. Further, in view of saving space and making the device small in scale, a display device is required to build-in a driving circuit. In order to realize such a display device, a TFT for forming a switching element and a driving circuit of a pixel needs to operate at high speed.

As a method of realizing a high speed operation of the TFT, for example, there are considered a method in which a semiconductor layer is made polycrystalline instead of amorphous, and a Dual Gate structure described in JP 2737780 B in which a pair of gate electrodes sandwich the semiconductor layer.

However, although the TFT is formed by using a polycrystalline silicon, its field-effect mobility is equal to or lower than 1/10 that of a single crystal silicon, for example, and the electric characteristics thereof are not as good as the characteristics of a MOS transistor formed on the single crystal silicon substrate after all. Further, there arises a new problem in that an OFF-current is increased due to a defect formed on grain boundary.

Moreover, when an integrated circuit is formed by using the TFT, a threshold voltage (Vth) needs to be controlled in order to obtain a desired switching operation. The threshold voltage (Vth) is an important parameter for expressing switching characteristics of the TFT. When this value is shifted from a desired value, it causes a trouble in circuit operation. Therefore, in order to control the threshold, for example, in the case of an n-channel TFT, there is a problem in that the value is shifted to the minus side and a normally-ON state (a state of ON without applying a gate voltage) occurs as a result. In order to prevent this, there is adopted means for shifting the threshold voltage to the plus side by adding an impurity (acceptor) for imparting p-type conductivity in a channel forming region is taken.

Furthermore, a data line side driving circuit is required to prevent deterioration due to a high driving ability (ON-current, $I_{on}$) and hot carrier effect to thereby improve reliability. On the other hand, in order to obtain a high quality picture, a switching element of a pixel portion needs to have a low OFF-current ($I_{off}$). As described above, in order to satisfy the demands for the liquid crystal display device, it is important to realize a TFT having characteristics required for the respective circuits.

Conventionally, the threshold control has been performed by adding an impurity element at a low concentration to the channel forming region. However, in the case of the structure in which a pair of gate electrodes sandwich the semiconductor layer, there is a problem in that a possibility of a carrier being caused on an interface between the semiconductor layer and an insulating film is high, the carrier is injected into the insulating film or the interface between the insulating film and the semiconductor layer, and thus the threshold rises. Further, in accordance with an energy band structure of this channel forming region, a path of the carrier exists only in the vicinity of the interface between the semiconductor layer and the insulating film. Therefore, there is a serious problem in that the hot carrier accelerated due to the voltage applied to the drain is injected into the insulating film or the interface between the insulating film and the semiconductor layer, and thus the mobility and a drain current are lowered.

SUMMARY OF THE INVENTION

Therefore, in view of the above-mentioned problems, an object of the present invention is to realize a highly reliable semiconductor device in which a high drain current and a high field-effect mobility are achieved.

The present invention relates to a semiconductor device comprising: a first gate electrode formed on an insulating surface; a first gate insulating film formed on the first gate electrode; a first semiconductor layer formed on the first gate insulating film; a second semiconductor layer formed on the first semiconductor layer; a third semiconductor layer formed on the second semiconductor layer; a second gate insulating film formed on the third semiconductor layer; and a second gate electrode formed on the second gate insulating film, characterized in that a channel region in which an intrinsic second semiconductor layer is formed is included between the first semiconductor layer and the third semiconductor layer in each of which an impurity element for imparting one conductivity is added at the concentration of $1 \times 10^{15}$ to $1 \times 10^{17}/\text{cm}^3$.

Further, the present invention is a semiconductor device comprising an n-channel TFT and a p-channel TFT on the same substrate, characterized in that:

the n-channel TFT and the p-channel TFT each have a first gate electrode on an insulating surface, a first gate insulating film on the first gate electrode, a first semiconductor layer on the first gate insulating film, a second semiconductor layer on the first semiconductor layer, a third semiconductor layer on the second semiconductor layer, a second gate insulating film on the third semiconductor layer, and a second gate electrode on the second gate insulating film;

channel regions of the first and third semiconductor layers of the n-channel TFT contain an impurity element for imparting p-type conductivity at the concentration of $1 \times 10^{15}$ to $1 \times 10^{17}/cm^3$;

a channel region of the second semiconductor layer of the n-channel TFT is formed of an intrinsic semiconductor or a semiconductor which contains an impurity element for imparting p-type conductivity at the concentration of $1 \times 10^{15}/cm^3$ or lower;

channel regions of the first and third semiconductor layers of the p-channel TFT contain an impurity element for imparting n-type conductivity at the concentration of $1 \times 10^{15}$ to $1 \times 10^{17}/cm^3$;

a channel region of the second semiconductor layer of the p-channel TFT is formed of an intrinsic semiconductor or a semiconductor which contains an impurity element for imparting n-type conductivity at the concentration of $1 \times 10^{15}/cm^3$ or lower, and the second semiconductor layer is formed between the first semiconductor layer and the third semiconductor layer in each of the n-channel TFT and the p-channel TFT.

When a voltage higher than a threshold voltage, which causes an inversion state, is applied to the TFT of the present invention, an inversion layer is widely formed in the intrinsic second semiconductor layer serving as a potential barrier, which is formed between the first semiconductor layer and the third semiconductor layer in each of which an impurity element for imparting one conductivity type is added. As a result, an area where the carrier flows is increased, the drain current becomes large, and thus a sub-threshold coefficient (S value) becomes small. An element of which S value is small can be said to be an ideal switch capable of fast switching operation.

Moreover, since the main inversion layer is formed in the second semiconductor layer, the carrier caused in this region is not scattered on the interface between the insulating film and the semiconductor layer. In comparison with a TFT having the structure of the conventional channel region, the value of field-effect mobility is improved. Furthermore, the second semiconductor layer is surrounded by a potential generated by a Fermi energy difference between the first semiconductor layer and the second semiconductor layer, or between the second semiconductor layer and the third semiconductor layer. This potential prevents the hot carrier caused in the second semiconductor layer from scattering and being injected into the insulating film. As a result, with the structure of the channel region of the present invention, an influence of the hot carrier degradation on the drain current can be reduced.

Note that the channel region is a region of the inversion state (i.e. a region having the inversion layer) in the semiconductor layer in which the carrier flows.

BRIEF DESCRIPTION OF THE DRAWINGS

In the accompanying drawings;

FIGS. 3A to 3C are diagrams showing an example of an embodiment of the present invention;

FIGS. 5A to 5C are diagrams showing an example of an embodiment of the present invention;

FIGS. 6A and 6B are diagrams showing an example of an embodiment of the present invention;

FIGS. 11A to 11F are diagrams showing examples of electric appliances;

DESCRIPTION OF THE PREFERRED EMBODIMENT

Figures 1, 2A:
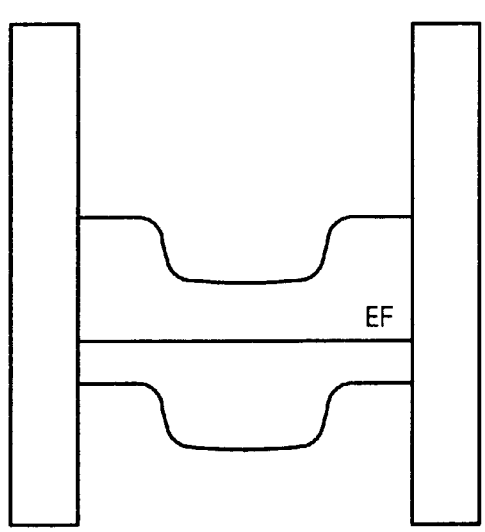
FIGS. 2A-1 to 2B-2 are diagrams showing an energy band structure of a channel region of the present invention.

FIG. 1 shows a semiconductor device disclosed in the present invention.

Figure 1A:
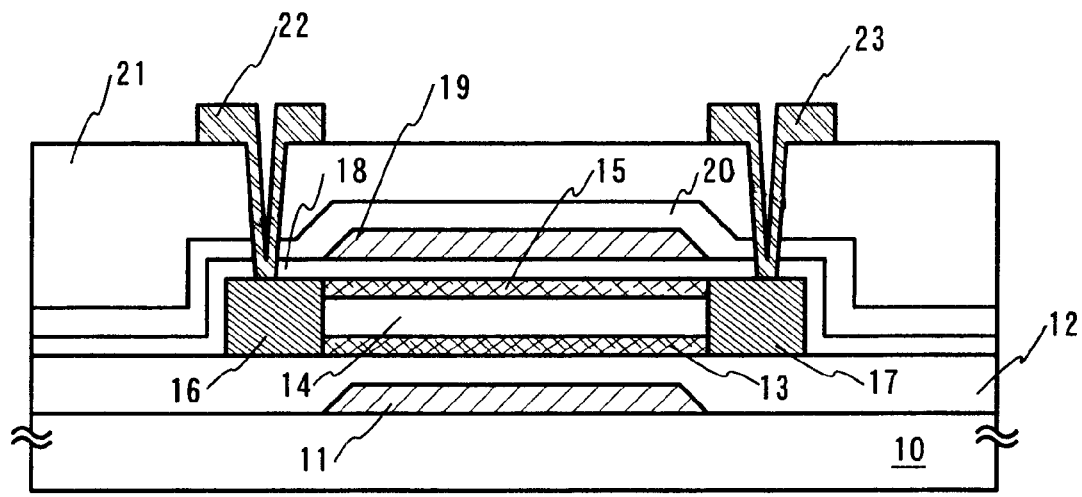
FIGS. 1A and 1B are diagrams showing a TFT of the present invention.

A structure described in FIG. 1A has a first gate electrode 11, a first gate insulating film 12, a first semiconductor layer 13, a second semiconductor layer 14, a third semiconductor layer 15, a second gate insulating film 18, and a second gate electrode 19, on a substrate 10. A structure described in FIG. 1B has low concentration impurity regions (also referred to as LDD region) 16a and 17a in which an impurity element for imparting conductivity type is added at a low concentration, between a channel region and a source region or a drain region 16b, 17b.

Note that in this specification, an electrode formed between the substrate and the semiconductor layer is called a first gate electrode and an electrode formed between the semiconductor layer and a pixel electrode is called a second gate electrode. Further, an insulating film formed in contact with the first gate electrode is called a first gate insulating film and an insulating film formed between the semiconductor layer and the second gate electrode is called a second gate insulating film.

The first semiconductor layer 13 is formed in contact with the first gate insulating film 12. To the channel region of the first semiconductor layer, an impurity element for imparting one conductivity type (for example, boron in the case of an impurity element for imparting p-type conductivity) is added at the concentration of $1 \times 10^{15}$ to $1 \times 10^{17}/cm^3$.

The second semiconductor layer 14 is formed in contact with the first semiconductor layer 13. An impurity element is not added to the channel forming region of the second semiconductor layer 14, and thus the second semiconductor layer 14 is substantially intrinsic.

The third semiconductor layer 15 is formed in contact with the second semiconductor layer 14. To the channel forming region of the third semiconductor layer 15, an impurity element for imparting one conductivity type (the conductivity type may be the same as that of the impurity element added to the first semiconductor layer.) is added at the concentration of $1\times10^{15}$ to $1\times10^{17}/cm^3$.

To the region as the source region or the drain region 16, 17 (16b, 17b) of the semiconductor layer, in the case of an n-channel TFT, an n-type impurity element is added at the concentration of $1\times10^{19}$ to $1\times10^{21}/cm^3$. Further, in the case of a p-channel TFT, a p-type impurity element is added at the concentration of $1\times10^{19}$ to $1\times10^{21}/cm^3$. Moreover, in the regions which serve as low concentration impurity regions (LDD regions) 16a and 17a, an impurity element for imparting conductivity is added at the concentration of $1\times10^{18}$ to $1\times10^{20}/cm^3$.

Figure 1B:
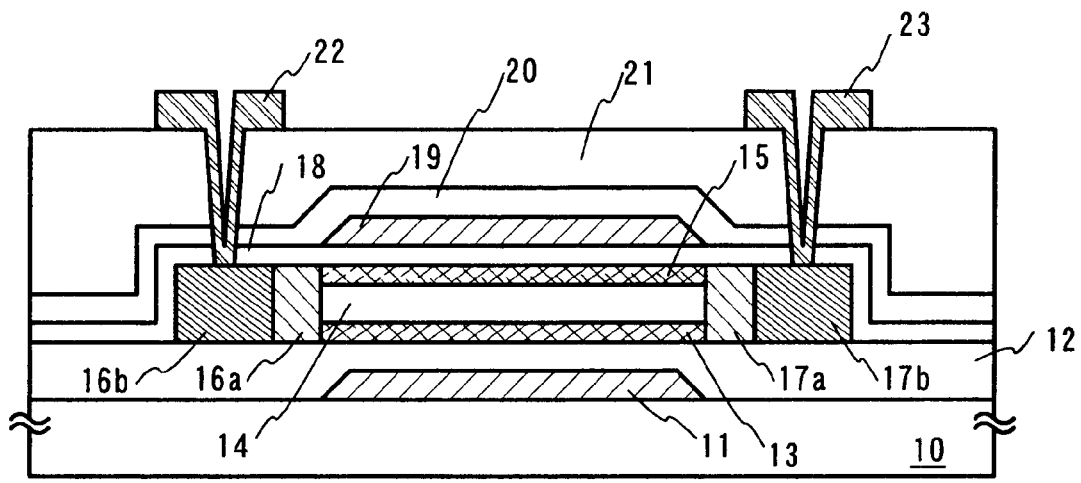
Figures 2, 2A:
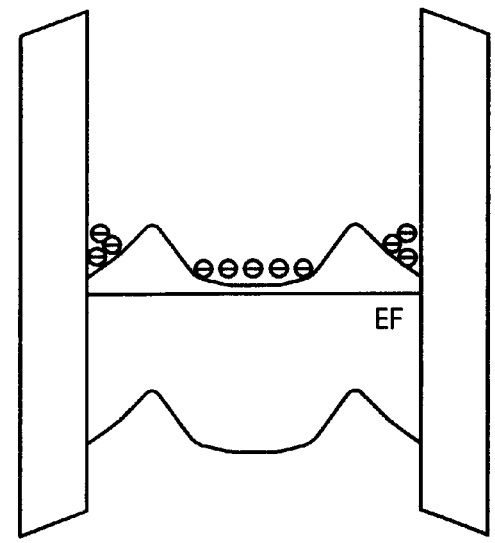
Figures 1, 2B:
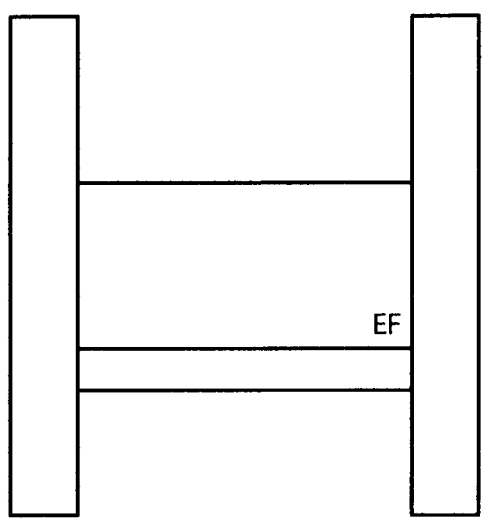
Figures 2, 2B:
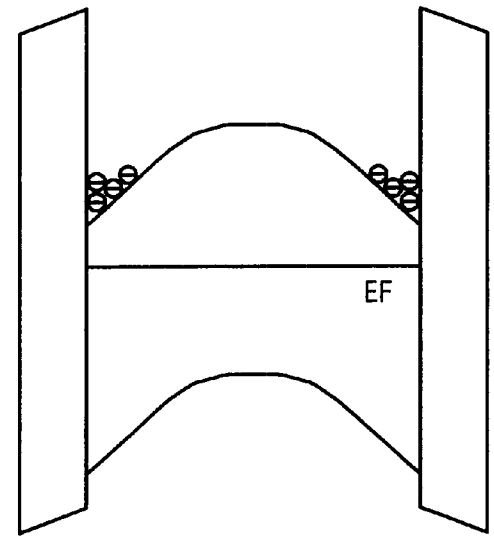

FIG. 2A-2 shows a band structure in the case where a voltage above a threshold voltage is applied to a TFT having the structure of the channel region as shown in FIGS. 1A and 1B (the structure in which plural semiconductor layers of different conductivity types are layered). Note that, as a comparison, FIG. 2B-2 shows a band structure in the case where a voltage above a threshold voltage is applied to a TFT having the structure of the channel forming region of the conventional TFT.

According to the present invention, a conduction band in an intrinsic region is close to Fermi level and an inversion layer is formed. As shown in FIG. 2A-2, a region where a carrier exists (a carrier can move) is formed over a wide range. Note that, in the case of the conventional channel structure, the inversion layer is formed on an interface between the semiconductor layer and the insulating film.

In the TFT of the present invention, the inversion layer is also formed on the interface between the semiconductor layer and the insulating film as in the conventional structure. However, even when a hot carrier is caused and injected into the insulating film or the interface between the semiconductor layer and the insulating film, the main inversion layer is a region which is formed in the intrinsic second semiconductor layer, and therefore it is possible to suppress such a degradation that a drain current is lowered or an S value becomes large. Further, since the inversion layer is formed over a wide area in the second semiconductor layer, the drain current becomes large and the S value becomes small. In addition, since it is possible to change the concentration of the impurity element contained in the first semiconductor layer and the third semiconductor layer in accordance with the thickness of the insulating film, a degree of freedom in controlling the threshold can be improved.

Next, when a voltage is applied so that the TFT turns to a storage state (OFF-state), in the TFT of the present invention, Fermi level approaches a mid-gap so that the inversion layer is not formed, and thus the current does not flow.

As described above, in the TFT of the present invention, operation capable of switching can be performed, in the same way as in the TFT of the conventional structure, and its characteristics including field-effect mobility, the S value, and the threshold voltage can be improved.

Embodiment 1

An example of manufacturing steps of a semiconductor device according to the present invention will be described with references FIGS. 3 to 6. The shape of the semiconductor device formed here is one example. It is not necessary to be limited to the form of the semiconductor device and manufacturing steps shown in this embodiment.

In FIG. 3A, a glass substrate, a quartz substrate, a ceramic substrate or the like can be used for a substrate 101. Alternatively, a substrate such as a silicon substrate, a metal substrate or a stainless substrate having an insulating film formed on the surface thereof may be used. It is also possible to use a plastic substrate having heat resistance against the treatment temperature in this embodiment.

Figure 7A:
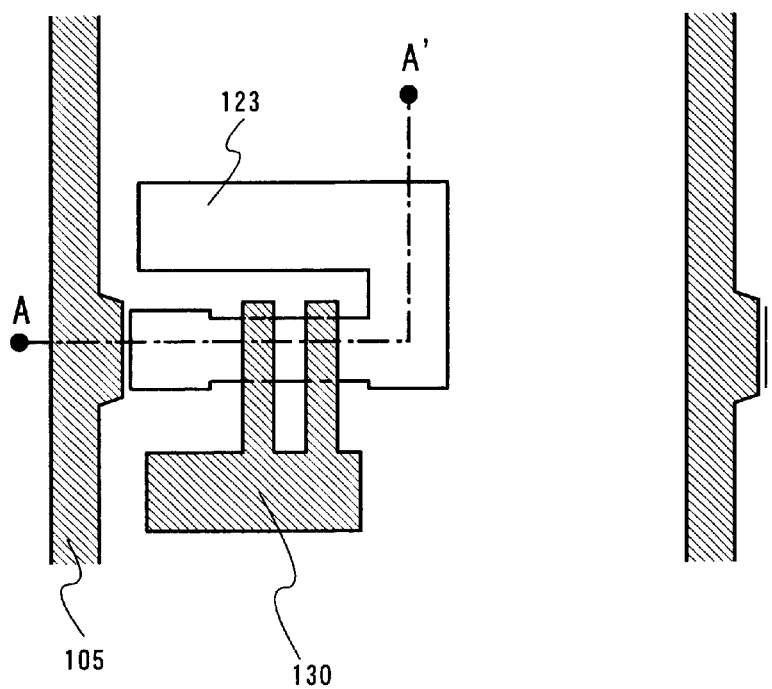
FIGS. 7A and 7B are diagrams showing an example of an embodiment of the present invention.

Wirings 102 to 108 to be a first gate electrode are formed on the insulating surface of the substrate 101. The first electrode are formed out of a conductive material made of one or a plurality of types of elements selected from among W, Mo, Ti and Ta. FIG. 7(A) is a top view of a wiring 105, a semiconductor layer 123 and the second wiring 130. Here, the wiring 105 is used for a data line.

The first insulating film 109 is formed out of a silicon oxynitride film to have a thickness of 10 to 50 nm. The first insulating film 109 can be a laminate structure consisting of a silicon oxide film or a silicon oxynitride film to have a thickness of 0.5 to 1 $\mu$m.

The surface of the first insulating film can be flattened. As a planarization method, the CMP method is used. As an abrasive material (slurry) for the CMP applied to the first insulating film, a KOH-added aqueous solution into which foamed silica particles obtained by thermally decomposing silicon chloride gas are dispersed, for example, may be used. By the CMP, the first insulating film 109 is removed by a thickness of about 0.1 to 0.5 $\mu$m to thereby flatten the surface thereof.

A semiconductor layer is formed on the first gate insulating film 109. The first semiconductor layer 110 is processed as following. An amorphous semiconductor layer is formed on the gate insulating film 109, and crystallized by using a known method (for example, a heating process using a furnace). Then, the first semiconductor layer 110 is formed to be a crystalline semiconductor layer. The thickness of the first semiconductor layer is 20 nm in this embodiment. Next, an impurity element imparting one conductivity type is added to a channel region. Next, regions 112a to 112c to which impurity elements imparting p-type (hereinafter referred to as p-type impurity elements) is added using a mask 111 are formed in the n-channel TFT region (FIG. 3B). A region 114 in which impurity elements imparting n-type is added using a mask 113 is formed in the p-channel TFT (FIG. 3C).

Figure 4A:
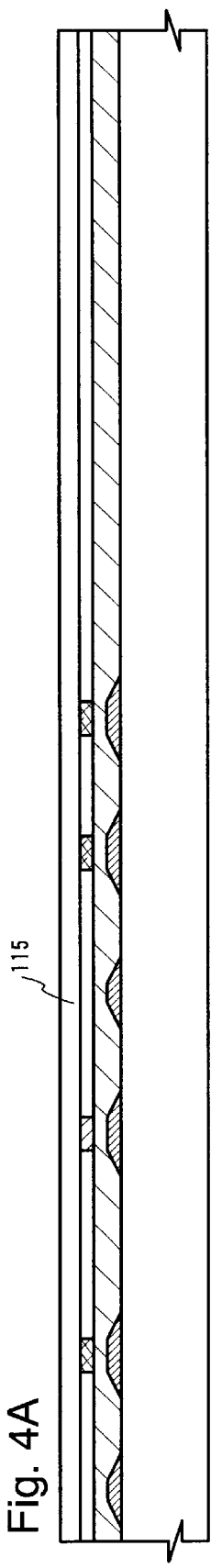
FIGS. 4A to 4C are diagrams showing an example of an embodiment of the present invention.

Next, the second semiconductor layer 115 is formed on the first semiconductor layer 110 (FIG. 4A). The second semiconductor layer 115 is formed to be a crystalline semiconductor layer by crystallizing an amorphous semiconductor layer which is formed on the first semiconductor layer 110 by carrying out a heating process. The second semiconductor layer 115 is thus obtained. The crystallization of the second semiconductor layer is preferable to use laser to prevent impurity elements of the first semiconductor layer from diffusion. The thickness of the second semiconductor layer is 50 nm in this embodiment.

Figure 4B:
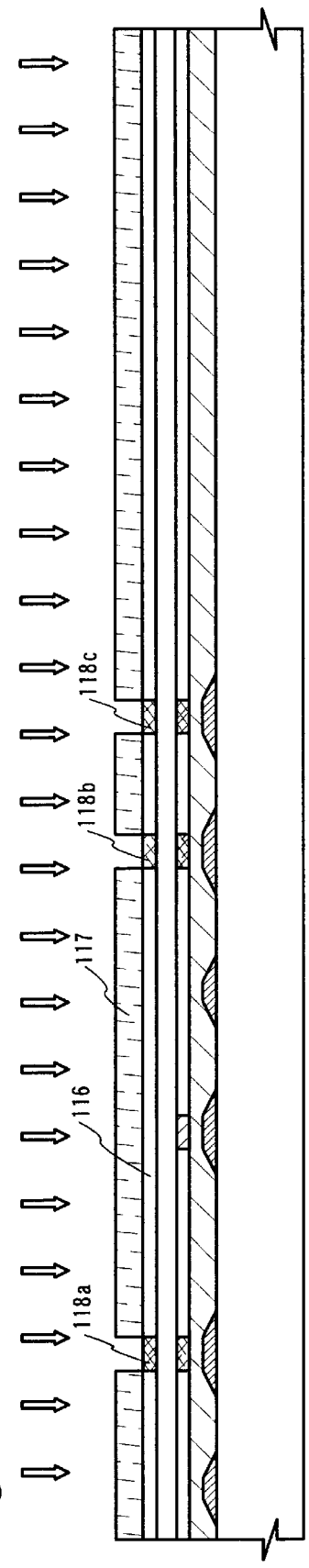
Figure 4C:
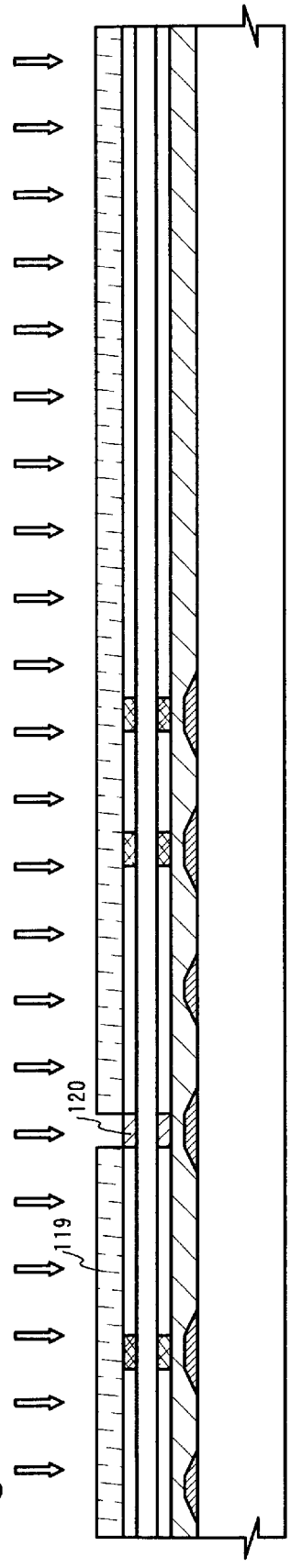

Next, the third semiconductor layer 116 is formed on the second semiconductor layer 115. Similar to the first semiconductor layer 110, the third semiconductor layer 116 is formed as following. An amorphous semiconductor layer is formed on the second semiconductor layer 115, and crystallized by using a known method (for example, a heating process using a furnace). Then, the third semiconductor layer 116 is formed to be the crystalline semiconductor layer. The thickness of the third semiconductor layer is 20 nm in this embodiment. Next, an impurity element imparting one conductivity type is added to a channel region. Regions 118a to 118c to which p-type impurity elements is added using a mask 117 are formed in the n-channel TFT region (FIG. 4B). A region 120 in which impurity elements imparting n-type is added using a mask 119 is formed in the p-channel TFT region (FIG. 4C).

The thickness of each semiconductor layer is set as above-mentioned in this embodiment, however, it is not necessary to be limited to these sizes. The thickness of each semiconductor layer is properly set by an operator.

The third semiconductor layer 116 is newly formed in this embodiment. However, the second semiconductor layer can be formed to have the thickness of the third semiconductor film substituting for forming the third semiconductor film. And, the impurity elements imparting one conductivity type can be added to the depth regarding as a thickness of third semiconductor layer.

The impurity elements imparting one conductivity type is added to the first semiconductor layer by using the following methods. An ion implantation method causing a mass separation, an ion doping method with low acceleration voltage and a plasma doping method. And the impurity elements, which is evaporated to the third semiconductor layer, is diffused to the third semiconductor layer by a heat treatment to add the impurity elements. An operator can properly be used one of the above-mentioned methods. The impurity elements imparting one conductivity type is added to the third semiconductor layer by using the following methods. An ion implantation method causing a mass separation, an ion doping method with a low acceleration voltage, plasma doping method. An operator can properly be used one of the above-mentioned methods. The thickness of the semiconductor layer is properly set by an operator.

In the case of using NMOS structure or PMOS structure, the channel structure of the present invention is possible to be formed in the form of doped-poly silicon film deposited and laminated in the state that one conductivity type impurity element is added. Moreover, in the case of using the CMOS structure, the channel structure of the present invention is also possible to, be formed in the form that the doped-poly silicon film is formed, and one conductivity type impurity element is added to the portion where the polarity is reversed by using masks.

The crystallization rate can be improved by irradiating laser light after the crystallization steps by heat treatment at any crystallization steps of semiconductor layer. The material of the amorphous semiconductor layer is not limited to a specific one, the amorphous semiconductor layer is preferably formed out of silicon, silicon germanium ($Si_xGe_{1-x}$, where $0<x<1$, typically $x=0.001$ to $0.05$) alloy or the like. Other than alloy, a compound semiconductor material such as GaAs, InP, SiC, ZnSe and GaN are also used for the amorphous semiconductor layer.

As above-mentioned, the channel structure in the form of that the impurity elements imparting one conductivity type at the density of $1\times10^{15}$ to $1\times10^{17}/cm^3$ is added to the channel region of the first and the third semiconductor layers. The channel region including intrinsic or trace impurity elements imparting one conductivity type is formed in the second semiconductor layer.

Thereafter, the semiconductor layers 121 to 123 is formed as shown in FIG. 5A by dividing the semiconductor layers 110, 115 and 116 using etching treatment.

As shown in FIG. 5B, the second gate insulating film 124 is formed to cover the semiconductor layers 121 to 123. The second gate insulating film 124 is formed out of an insulator including silicon by using plasma CVD method or sputtering method. The thickness is set to be 40 to 150 nm.

Figure 7B:
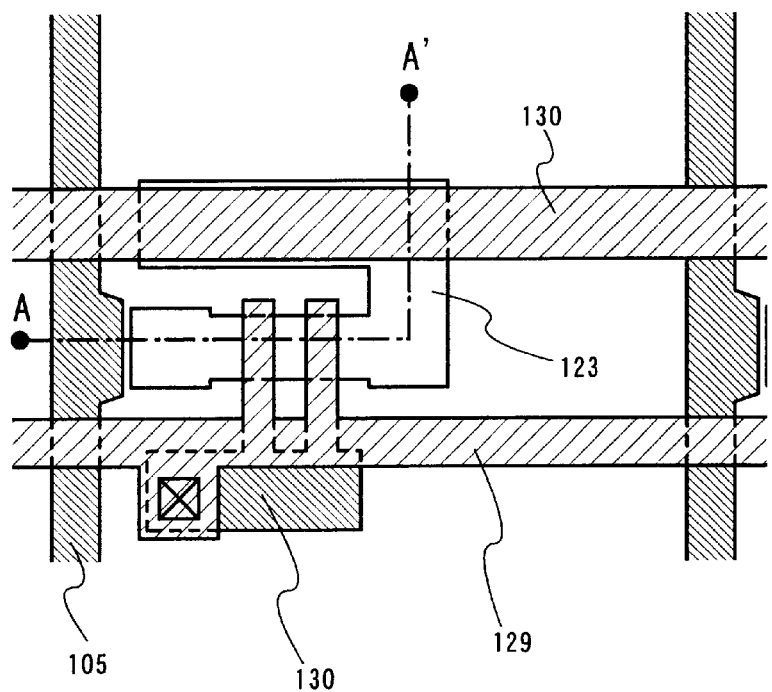

Conductive films for forming a gate electrode and a wiring, are formed on the second gate insulating film 124. According to this embodiment, the second electrode is formed by layering two or more conductive films. A first conductive film 125 provided on the second gate insulating film 124 is formed out of a nitride of high melting point metal such as molybdenum or tungsten. A second conductive film 126 provided on the first conductive film 125 is formed out of high melting point metal, low resistance metal such as copper or aluminum or polysilicon. More specifically, as the first conductive film 125, a metal nitride of one or a plurality of elements selected from among W, Mo, Ta and Ti is used. As the second conductive film 126, alloy of one or a plurality of elements selected from W, Mo, Ta, Ti, Al and Cu or n-type polycrystalline silicon is used. Next, the first conductive film 125 and the second conductive film 126 are carrying out a first etching process using a mask (not illustrated) to thereby form the second electrodes 127 to 130. FIG. 7B is a top view of the above process.

First electrodes each having tapered end sections (not illustrated) are formed by the first etching treatment. In the first doping, using the first electrodes as masks, the first concentration n-type impurity regions are formed in the semiconductor films 121 to 123, respectively. The first concentration is set at $1\times10^{20}$ to $1.5\times10^{21}/cm^3$.

Next, the second etching treatment is carried out without removing a mask made of resist. In the second etching treatment, second electrodes are formed by subjecting first electrodes to anisotropic etching. The second electrodes are formed so that the widths thereof are reduced by the second etching treatment and the end sections thereof are located inward of the first concentration n-type impurity regions. The length of an LDD is determined according to each reduced width.

In this state, the second doping treatment is carried out to thereby inject n-type impurity elements into the semiconductor films 121 to 123. Second concentration impurity regions by the second doping treatment are formed to be overlapped with the first conductive films which constitute the second electrodes (the second gate electrodes) 127 to 130 in a self-aligned fashion, respectively. The second gate electrodes 127 to 130 are formed out of the second shape type first conductive films 127a to 130a and the second shape type second electrodes 127b to 130b. Since the impurities doped by the ion doping method are passed through the first conductive films 127a to 130a and then added to the semiconductor films, the number of ions which reach the semiconductor films decreases and the ion concentration of each semiconductor film, quite naturally, becomes low. The concentration is $1\times10^{17}$ to $1\times10^{19}/cm^3$.

Next, masks made of resist are formed to cover the region of the n-channel TFT and the third doping treatment is carried out. In this third doping treatment, p-type impurity regions 132 and 135 injected third concentration p-type impurity elements are formed in the semiconductor film 122. P-type impurity elements are added to the third concentration p-type impurity regions in a concentration range of $1.5\times10^{20}$ to $1.5\times10^{21}/cm^3$.

Because of the above steps, the impurity doped regions intended for valence electron control, the high n-type impurity ($1\times10^{19}$ to $1\times10^{21}/cm^3$) doped regions 131 and 133 and the low n-type impurity ($1\times10^{18}$ to $1\times10^{20}/cm^3$) doped regions 134 and 136 are formed in the second gate electrode and the semiconductor films of TFT, respectively. The first gate electrodes 103, 104, 106 and 108 and the second gate electrodes 127 to 129 function as gate electrodes at positions at which the electrodes cross the semiconductor films, respectively. The second wiring 130 is one of the capacitor wiring of retention capacitor elements. (FIG. 5C)

Thereafter, a step of activating the impurity elements doped into the respective semiconductor films is executed.

In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needless to say, the RTA method, which uses a lamp light source instead of laser light, is also applicable. In the RTA method, the lamp light source is radiated from the both sides or one side of a substrate to thereby heat the semiconductor films.

Thereafter, as shown in FIG. 6A, an interlayer insulating film 137 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a second insulating film 138 made of an organic insulating material is formed on the first interlayer insulating film 137. The reason for using the organic insulating material is to flatten the surface of the second interlayer insulating film 138. To obtain a more completely flattened surface, the surface of the second interlayer insulating film 138 is preferably subjected to a planarization treatment by the CMP method. If the CMP is used in combination with the planarization, a silicon oxide film formed by the plasma CVD method can be used. In addition, an SOG (Spin on Glass) film or a PSG film formed by a coating method, or the like can be used as the second interlayer insulating film 138.

Figure 8:
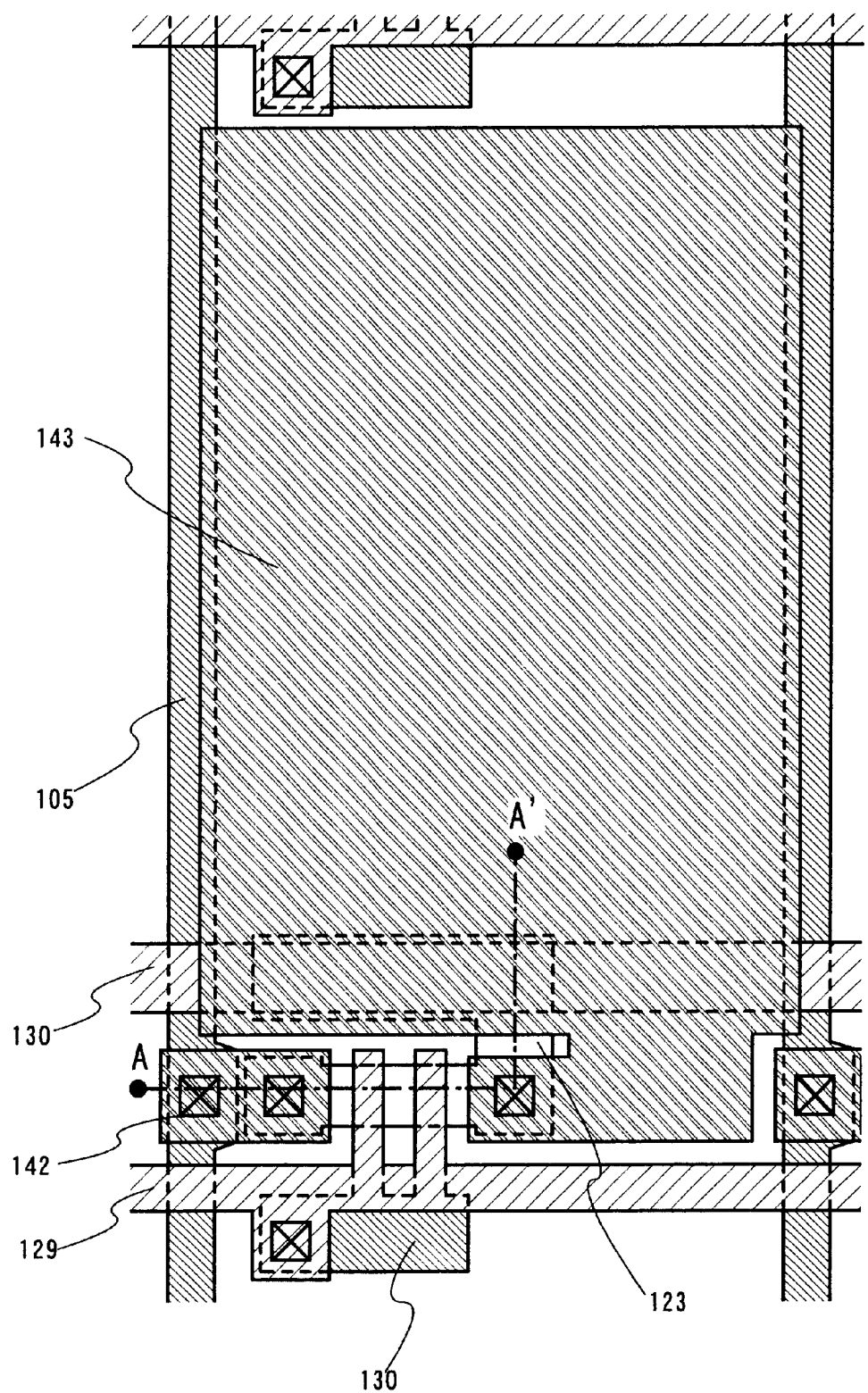
FIG. 8 is a diagram showing an example of an embodiment of the present invention.

Contact holes are formed in the first gate insulating film, the second gate insulating film, the first interlayer insulating film or the second gate insulating film and the second interlayer insulating film are formed. Thereafter, wirings 139 to 143 and the pixel electrode 144 are formed. For example, the wirings can be formed by layering a titanium film and an aluminum film. (FIG. 6B) FIG. 8 is a top view of the active matrix substrate manufactured according to above steps.

As above-mentioned, an active matrix substrate including a driver circuit 205 formed out of n-channel TFT 201 and p-channel TFT 202 on the same substrate and the pixel portion 206 having a pixel TFT 203 for switching and a retention capacitor element 204 can be realized to form.

Figure 14A:
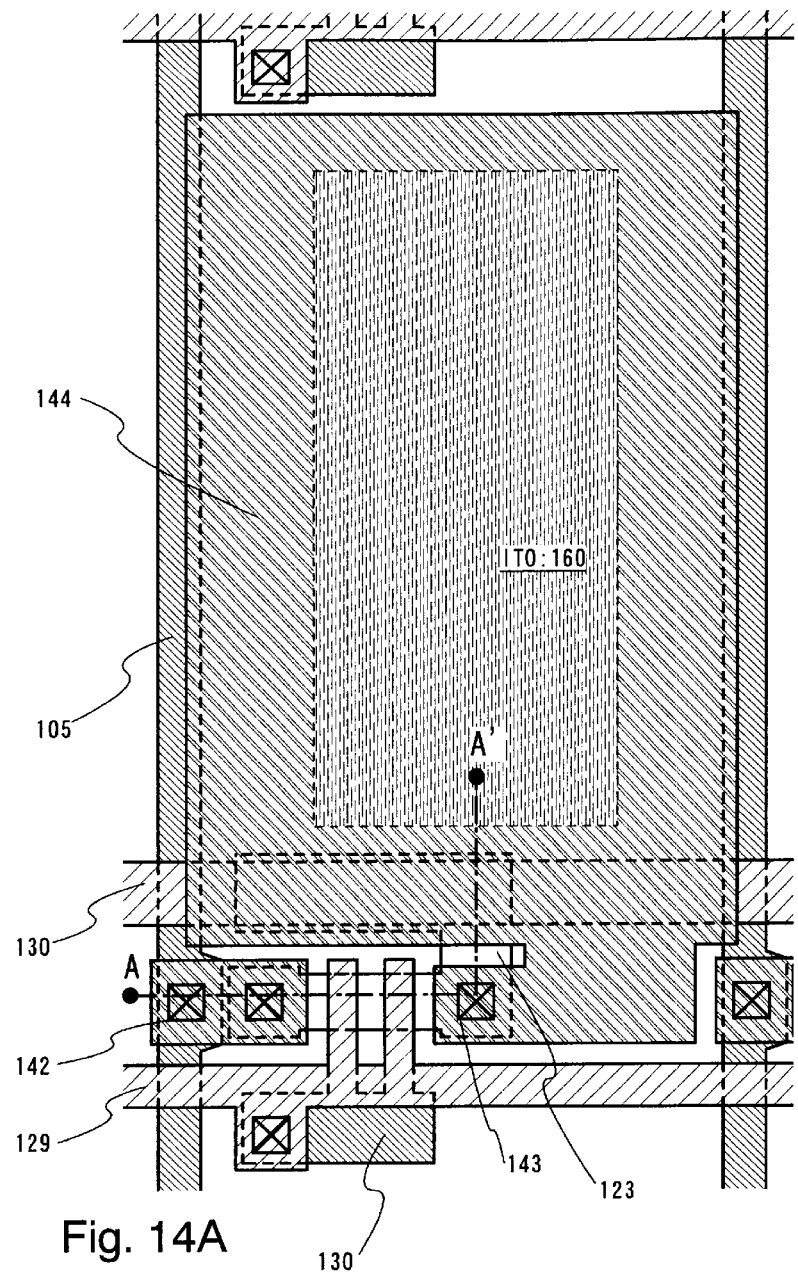
FIGS. 14A and 14B are diagrams showing an example of an embodiment of the present invention.
Figure 14B:
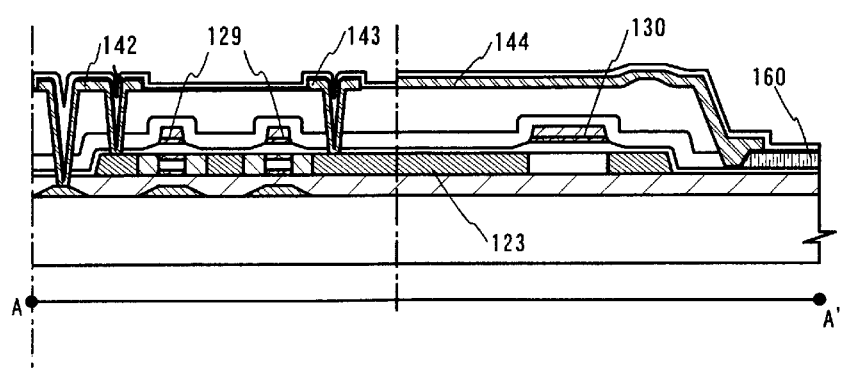

As shown in FIG. 14, a semi-transparent display device can be formed. A reflection electrode 144 which become a reflection electrode (typically, a conductive film mainly made of Al as shown in this embodiment) and a transparent type electrode 160 which become a transparent electrode (typically, indium oxide and tin oxide (ITO)) are used for the pixel electrode of the display device. The reflection electrode can be formed on irregularities by carrying out the etching treatment on the surface of the interlayer insulating film to improve the reflection efficiency.

The n-channel TFT 201 of the driver circuit 205 is comprised by the following, the first gate electrode 103, the first gate insulating film 109, the first semiconductor layer 112a and the third semiconductor layer 118a that is doped a p-type impurity elements at the concentration of $1 \times 10^{15}$ to $1 \times 10^{17}/cm^3$, the channel region made of the substantial intrinsic second semiconductor layer 150 between the first semiconductor layer and the third semiconductor layer, the low concentration (n-type) impurity region 134, the semiconductor layer 121 including a high concentration (n-type) impurity region 131 functioning a source region or a drain region, the second gate insulating film 124 and the second gate electrode 127.

The p-channel TFT 202 of the driver circuit 205 is comprised by the following, the first gate electrode 104, the first gate insulating film 109, the first semiconductor layer 114 and the third semiconductor layer 120 that is doped a p-type impurity elements at the concentration of $1 \times 10^{15}$ to $1 \times 10^{17}/cm^3$, the channel region made of the substantial intrinsic second semiconductor layer 151 between the first semiconductor layer and the third semiconductor layer, the low concentration (p-type) impurity region 135, the semiconductor layer 122 including a high concentration (p-type) impurity region 132 functioning a source region or a drain region, the second gate insulating film 124 and the second gate electrode 128.

TFT 203 of the pixel portion 206 is comprised by the following, the first gate electrodes 105, 106, the first gate insulating film 109, the first semiconductor layers 112b, 112c, and the third semiconductor layer 118b, 118c that is doped a p-type impurity elements at the concentration of $1 \times 10^{15}$ to $1 \times 10^{17}/cm^3$, the channel region made of the substantial intrinsic second semiconductor layer 152 between the first semiconductor layer and the third semiconductor layer, the low concentration (n-type) impurity region 136, the semiconductor layer 123 including a high concentration (n-type) impurity region 133 functioning a source region or a drain region, the second gate insulating film 124 and the second gate electrode 129.

The retention capacitor element 204 of the pixel portion 206 is formed out of the semiconductor layer 123 continuously formed from semiconductor layer 123 of the pixel TFT, the second capacitor wiring 130 and the gate insulating film 124 functioning dielectric.

The low concentration impurity region (LDD region) is formed to have a length of 0.5 to 2.5 μm, preferably 1.5 μm in a channel length direction. The configuration of such an LDD is intended to prevent the deterioration of the TFT due to the hot carrier effect.

A shift resistor circuit, a buffer circuit, a level shifter circuit and a latch circuit can be formed by n-channel type TFT and p-channel type TFT. Especially, the structure of the n-channel TFT 201 is suitable for the buffer circuit having high driving voltage to prevent the deterioration due to the hot carrier effect.

The present invention can be applied to the circuit which is on the basis of NMOS and PMOS without employing CMOS structure.

Embodiment 2

This embodiment describes an example of a manufacturing process of an active matrix type liquid crystal display device from the active matrix substrate obtained in Embodiment 1.

Figure 9:
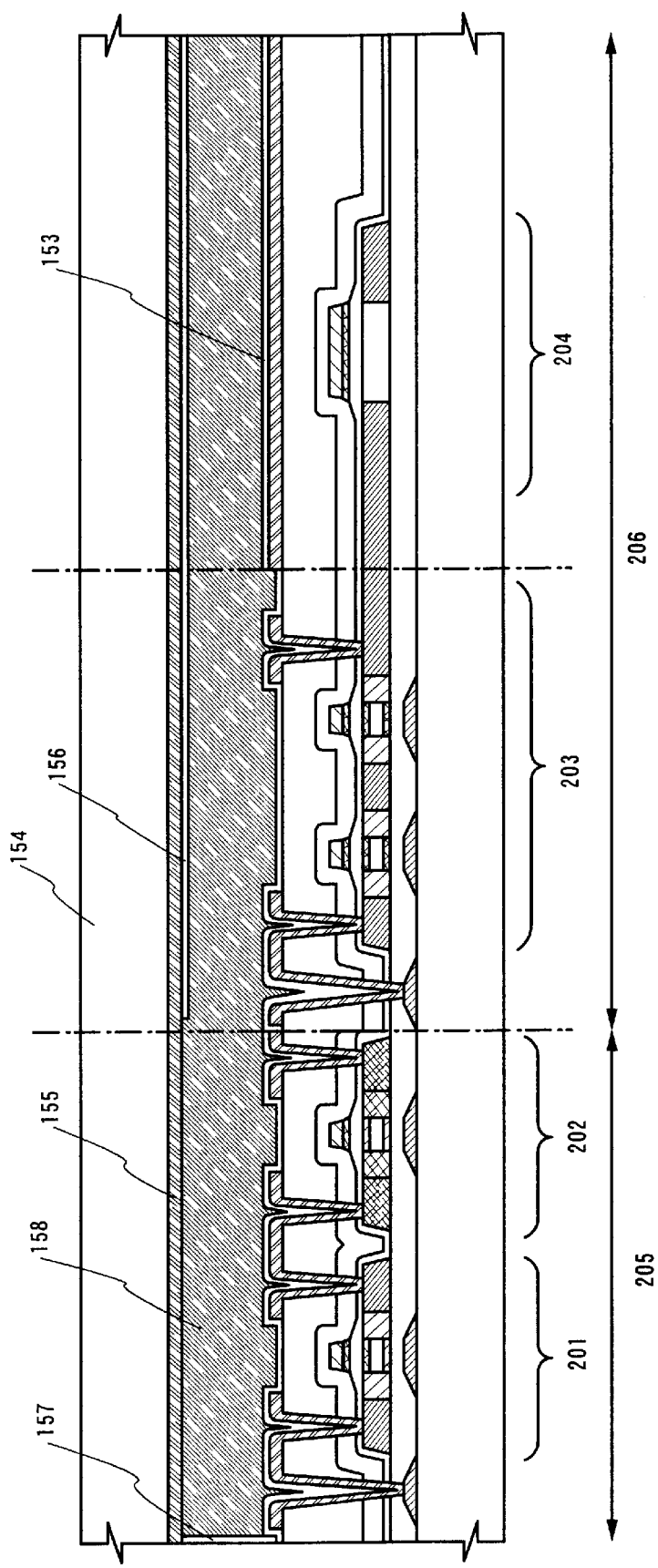
FIG. 9 is a diagram showing an example of an embodiment of the present invention.

After the active matrix substrate in the state of FIG. 6B is obtained, an oriented film 153 is formed on the active matrix substrate and subjected to rubbing treatment as shown as FIG. 9. Though not shown in the drawing, prior to the oriented film 153, columnar spacers may be formed at desired positions by patterning an organic resin film such as an acrylic resin film. The spacers are for keeping distance between substrates. Instead of columnar spacers, spherical spacers may be sprayed onto the entire surface of the substrate.

Next, an opposite electrode 155 is formed on an opposite substrate 154, and an oriented film 156 is formed on the electrode and subjected to rubbing treatment. The opposite electrode 155 is formed of ITO. Then, the opposite substrate 154 is bonded to the active matrix substrate on which a single pattern 157, using a sealing agent (not shown). Then, a liquid crystal material 158 is injected between the substrates and an end-sealing agent is used to completely seal the substrates. A known liquid crystal material can be used as the material 158. In such a manner, the active matrix driving liquid crystal display device as shown in FIG. 9 is completed.

Embodiment 3

The present invention can be applied also to TFT structure other than the TFT structure shown in Embodiment Mode and Embodiment 1. The numeral reference used in FIG. 1 is used in this embodiment.

Figure 10:
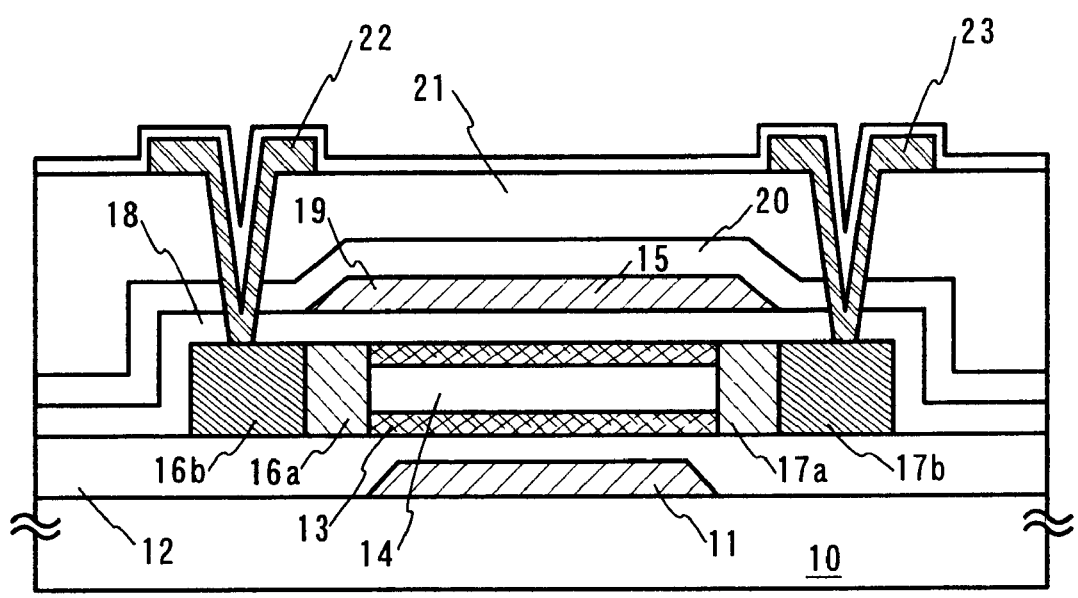
FIG. 10 is a diagram showing an example of an embodiment of the present invention.

FIG. 10 shows a structure which is comprising the following; from the bottom, a substrate 10, a first gate electrode 11, a gate insulating film 12, a first semiconductor layer 13, a second semiconductor layer 14, a third semiconductor layer 15, a second gate insulating film 18 and the second gate electrode 19. The impurity elements imparting one conductivity type (the impurity element is p-type in the case of n-channel type TFT, or n-type in the case of p-channel type TFT) at the density of $1\times10^{15}$ to $1\times10^{17}/cm^3$ is added to the channel region of the first semiconductor layer 13 and the third semiconductor layer 15.

In the first semiconductor layer 13, the second semiconductor layer 14 and the third semiconductor layer 15 have a source or drain region to which impurity elements imparting a different conductivity from that is added to a channel region (the impurity element is p-type in the case of n-channel type TFT, or n-type in the case of p-channel type TFT) is added in high concentration ($1\times10^{20}$ to $5\times10^{21}/cm^3$), and low concentration impurity regions (also referred to as LDD regions) 16a and 17a to which impurity elements imparting a different conductivity from that is added to a channel region is added in low concentration ($1\times10^{18}$ to $1\times10^{20}/cm^3$).

The first gate electrode 11 is formed to overlap with the channel region through the first gate insulating film 12. The second gate electrode 19 is formed to overlap with LDD regions 16a and 17a through the second gate insulating film 18.

This structure that the gate electrode is overlapped with LDD region though the insulating film is known as GOLD (gate-drain overlapped LDD) structure. It is known that with such a structure, a high electric field near the drain is relaxed to prevent hot carrier injection and thus a deterioration phenomenon is effectively prevented.

By combining above-mentioned GOLD structure with the present invention, deterioration due to hot carrier injection is prevented. In addition, a semiconductor device having high field effect movement, drain current, low S value, threshold and high reliability can be realized to form.

Embodiment 4

This embodiment describes a semiconductor device in which energy band structure shown in FIG. 2(A-1) is formed in a channel region by being mixed semiconductor laminated. FIG. 2(B-1) illustrates the semiconductor device which includes the channel region having a conventional energy band structure.

As well as Embodiment Mode 1, the first gate electrode and the first gate insulating film are formed sequently on a substrate.

Next, $Al_xGaAs_{1-x}$ film as the first semiconductor layer is formed on the first gate insulating film. Continuously, GaAs film as the second semiconductor layer is formed on the first semiconductor layer. Further, $Al_xGaAs_{1-x}$ film as the second semiconductor layer is formed on the third semiconductor layer.

According to Embodiment 1, the semiconductor device having a energy band structure shown in FIG. 2(A-1) can be realized by the following steps. The second gate insulating film is formed and the second gate electrode thereon. N-type impurity elements are added to source or drain region of n-channel type TFT, and p-type impurity elements are added to source or drain region of p-channel type TFT.

Therefore, by being the mixed crystal semiconductor film laminated, the channel region having the energy band structure as shown in FIG. 2(A-1) can be formed without being impurity elements doped semiconductor film laminated.

Embodiment 5

The CMOS circuit and the pixel portion formed by implementing the present invention can be used in active matrix type liquid crystal display (liquid crystal display device). That is, the present invention can be implemented in all of electronic apparatus integrated with the liquid crystal display device at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 11A–11F, 12A–12D and 13A–13C.

FIG. 11A shows a personal computer including a main body 2001, an image input portion 2002, a display portion 2003 and a keyboard 2004.

FIG. 11B shows a video camera including a main body 2101, a display portion 2102, a voice input portion 2103, operation switches 2104, a battery 2105 and an image receiving portion 2106.

FIG. 11C shows a mobile computer including a main body 2201, a camera portion 2202, an image receiving portion 2203, an operation switch 2204 and a display portion 2205.

FIG. 11D shows a goggle type display including a main body 2301, a display portion 2302 and an arm portion 2303.

FIG. 11E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet.

FIG. 11F shows a digital camera including a main body 2501, a display portion 2502, an eye contact portion 2503, operation switches 2504 and an image receiving portion (not illustrated).

Figure 12A:
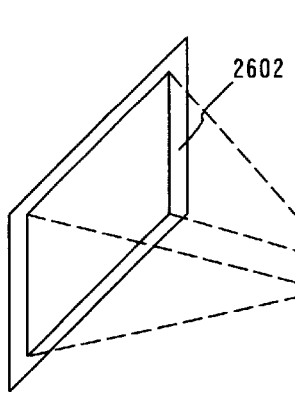
FIGS. 12A to 12D are diagrams showing examples of electric appliances.

FIG. 12A shows a front type projector including a projection apparatus 2601 and a screen 2602.

Figure 12B:
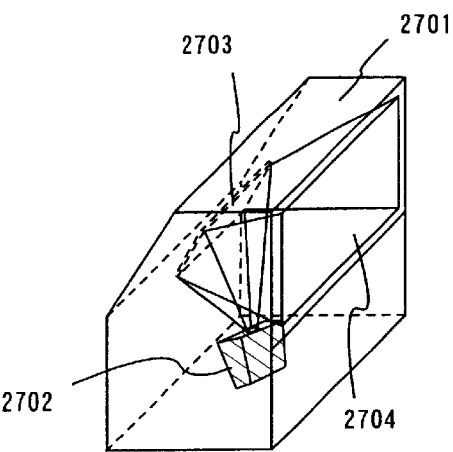

FIG. 12B shows a rear type projector including a main body 2701, a projection apparatus 2702, a mirror 2703 and a screen 2704.

Figure 12C:
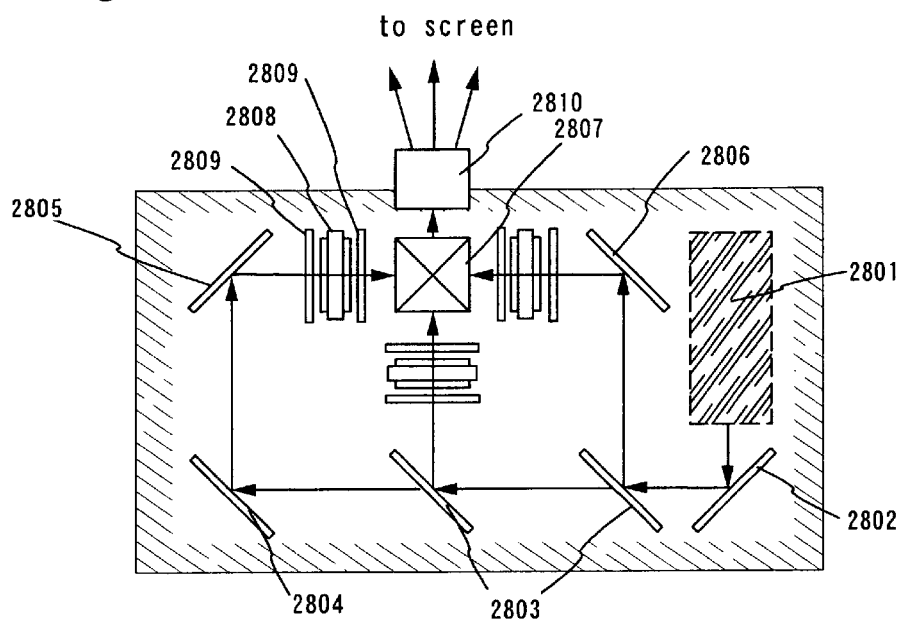

Further, FIG. 12C is a view showing an example of a structure of the projection apparatus 2601 and 2702 in FIG. 12A and FIG. 12B. The projection apparatus 2601 or 2702 is constituted by a light source optical system 2801, mirrors 2802, 2804–2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 12C.

Figure 12D:
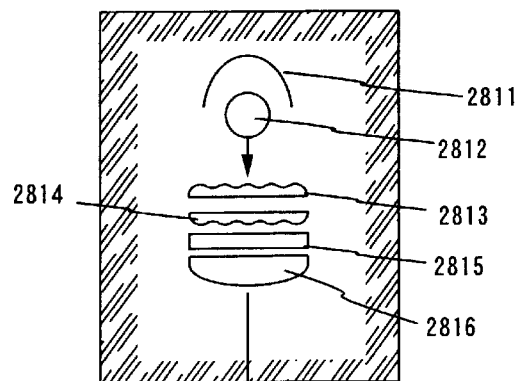

Further, FIG. 12D is a view showing an example of a structure of the light source optical system 2801 in FIG. 12C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 12D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 12, there is shown a case of using a transmission type liquid crystal display device and an example of applying a reflection type liquid crystal display device is not illustrated.

Figure 13A:
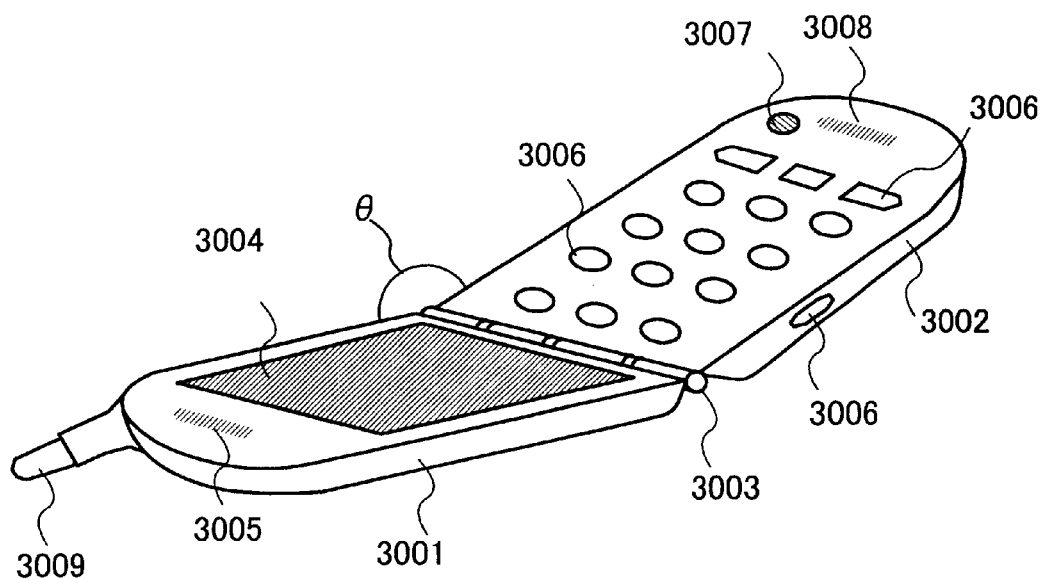
FIGS. 13A to 13C are diagrams showing examples of electric appliances.

FIG. 13A shows a portable telephone including a display panel 3001, an operation panel 3002. The display panel 3001 and the operation panel 3002 is connected to each other in the connecting portion 3003. In the connecting panel 3003, the angle θ of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included.

Figure 13B:
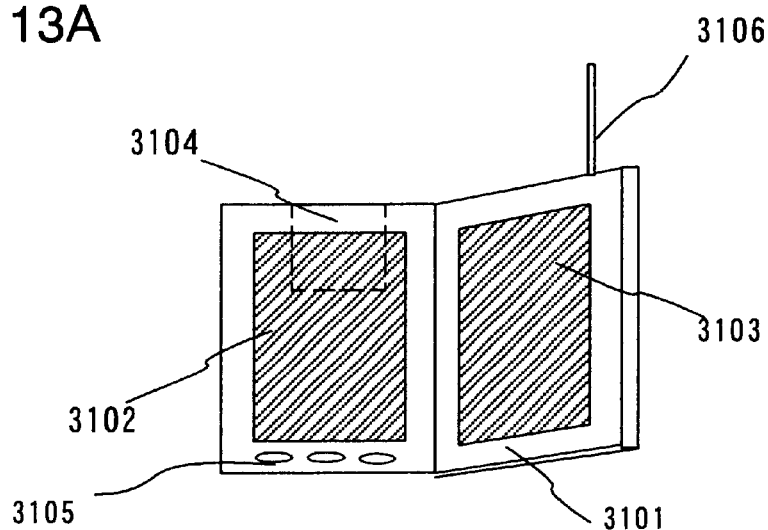

FIG. 13B shows a portable book (electronic book) including a main body 3101, display portions 3102 and 3103, a record medium 3104, an operation switch 3105 and an antenna 3106.

Figure 13C:
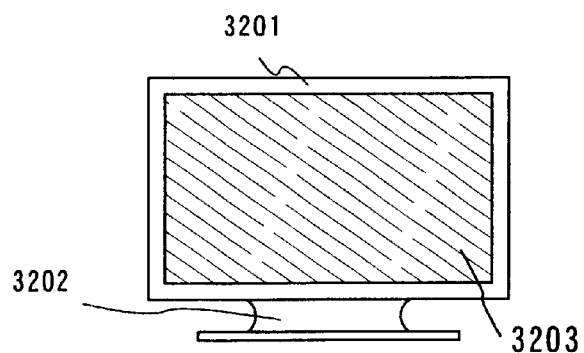

FIG. 13C shows a display including a main body 3201, a support base 3202 and a display portion 3203. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields.

Embodiment 6

In this embodiment, simulations such as gm, drain current were done by means of Dual Gate structure of the present invention (constitution (a)) and general Dual Gate structure (constitution (b)). Note that each of transistors of constitution (a) and constitution (b) has L/W=10/8 μm and single drain structure. Further, in constitution (a), each of the first and third semiconductor layers has a thickness of 10 nm, the second semiconductor layer has a thickness of 30 nm, and each channel region of the first and second semiconductor layers was added boron at the concentration of $2\times10^{16}/cm^3$ and a channel region of the second semiconductor layer is an intrinsic region (concentration of carrier is $1\times10^{10}/cm^3$.) Moreover, in constitution (b), the semiconductor layer has a thickness of 50 nm, and a channel region of the semiconductor layer is added boron at the concentration of $2\times10^{16}/cm^3$. These simulation results are shown in FIGS. 15A and 15B.

Figure 15A:
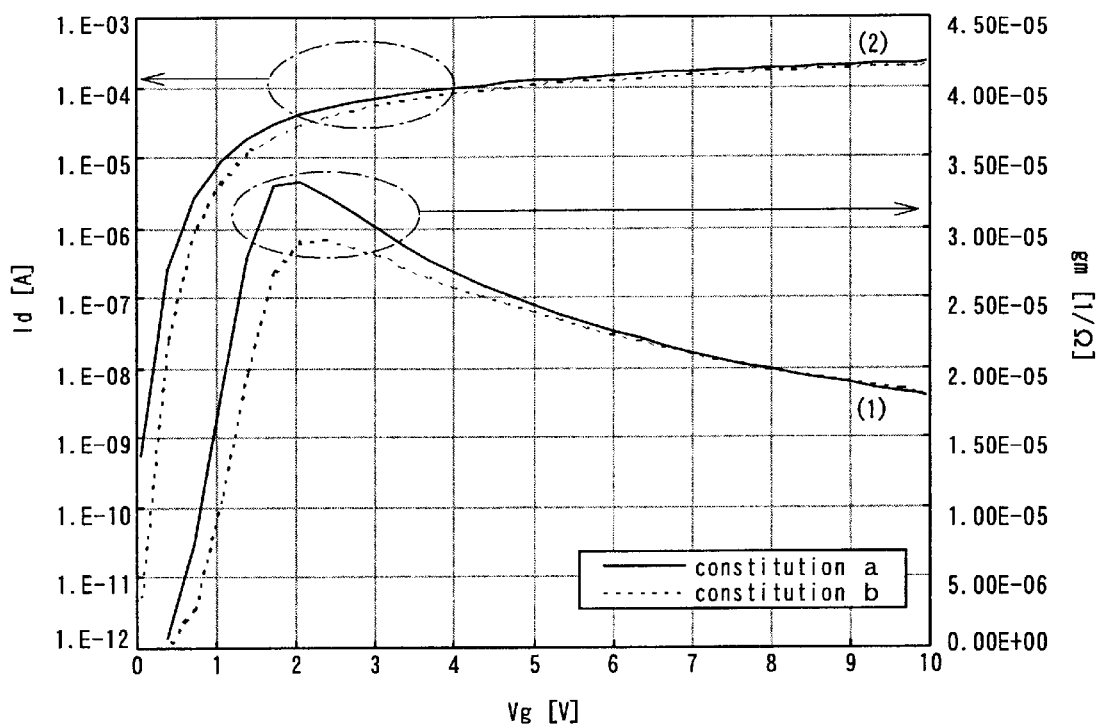
FIGS. 15A and 15B are graphs showing gm(transconductance), Vg-Id characteristic and Vd-Id characteristic.

The graph (1) where gm (trans-conductance) is shown and the graph (2) where Vg-Id characteristic is shown are described in FIG. 15A. As shown in graph (1), it is understood that gm of constitution (a) is higher than gm of constitution (b). This gm has a certain proportion relation with mobility, therefore, the mobility of constitution (a) is larger than the mobility of constitution (b).

Moreover, as shown in graph (2), the drain current (Id) of constitution (a) is higher than Id of constitution (b) in the saturation region. Comparing the constitution (a) having high Id and the constitution (b) having the same Id as the constitution (a), the channel region of the constitution (a) is smaller than that of the constitution (b). Therefore, the constitution (a) realizes high accumulation of the transistor.

Figure 15B:
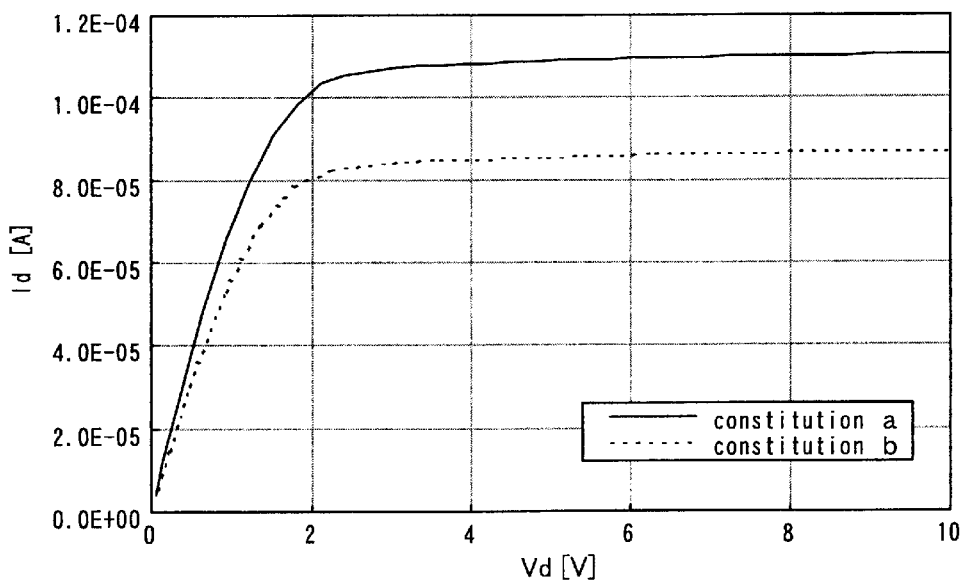

The graph where the Vd-Id characteristic is shown is described in FIG. 15B. As shown in FIG. 15B, the drain current (Id) of the constitution (a) is higher than Id of the constitution (b). Comparing the constitution (a) having high Id and the constitution (b) getting the same Id as the constitution (a), the channel region of the constitution (a) is smaller than that of the constitution (b). Therefore, the constitution (a) realizes high accumulation of the transistor.

According to the present invention, the transistor improved in the mobility and drain current is obtained. The transistor improved in the mobility and drain current is desirable for driver circuit.

When a voltage higher than a threshold voltage, which causes an inversion state, is applied to the TFT having the structure of the present invention, the inversion layer is formed over a wide area in the intrinsic second semiconductor layer serving as a potential barrier, which is formed between the first semiconductor layer and the third semiconductor layer in which an impurity element for imparting one conductivity type is added. As a result, an area where the carrier flows is increased, the drain current becomes large, and thus a sub-threshold coefficient (S value) becomes small. An element of which S value is small can be said to be an ideal switch capable of fast switching operation.

Further, since the main inversion layer is formed in the second semiconductor layer by taking the above-mentioned structure of the channel region, the hot carrier caused in the second semiconductor layer is not scattered on and not injected into the insulating film interface. Accordingly, the field-effect mobility is improved, and since the second semiconductor layer is surrounded by the potential generated due to the Fermi energy difference between the first semiconductor layer and the second semiconductor layer, or between the second semiconductor layer and the third semiconductor layer, it is possible to prevent the hot carrier caused in the second semiconductor layer from scattering and being injected into the insulating film, thereby being capable of reducing an influence of the hot carrier degradation on the drain current.

As described above, according to the present invention, it is possible to realize a semiconductor device which is excellent in reliability and electric characteristics.

What is claimed is:

1. A semiconductor device comprising:
    a first gate electrode formed on an insulating surface;
    a first gate insulating film formed on the first gate electrode;
    a first semiconductor layer formed on the first gate insulating film;
    a second semiconductor layer formed on the first semiconductor layer;
    a third semiconductor layer formed on the second semiconductor layer;
    a second gate insulating film formed on the third semiconductor layer; and
    a second gate electrode formed on the second gate insulating film,
    wherein:
        channel regions of the first and third semiconductor layers contain an impurity element for imparting the same conductivity at the concentration of $1\times10^{15}$ to $1\times10^{17}/cm^3$;

a channel region of the second semiconductor layer is formed of an intrinsic semiconductor.

2. A semiconductor device according to claim 1, wherein the first gate electrode and the second gate electrode are formed of an alloy or a compound composed of one kind or plural kinds of elements selected from the group consisting of tungsten (W), molybdenum (Mo), tantalum (Ta), and titanium (Ti).

3. A semiconductor device according to claim 1, wherein the semiconductor device is implemented in an electronic apparatus selected from the group consisting of a personal computer, a video camera, a mobile computer, a player using a record medium recorded with programs, a digital camera, a front type projector, a rear type projector, a portable telephone, a portable book and a display.

4. A semiconductor device comprising an n-channel TFT and a p-channel TFT formed on the same substrate,
wherein:
the n-channel TFT and the p-channel TFT each have a first gate electrode formed on an insulating surface, a first gate insulating film formed on the first gate electrode, a first semiconductor layer formed on the first gate insulating film, a second semiconductor layer formed on the first semiconductor layer, a third semiconductor layer formed on the second semiconductor layer, a second gate insulating film formed on the third semiconductor layer, and a second gate electrode formed on the second gate insulating film;
channel regions of the first and third semiconductor layers of the n-channel TFT contain an impurity element for imparting p-type conductivity at the concentration of $1\times10^{15}$ to $1\times10^{17}/cm^3$;
a channel region of the second semiconductor layer of the n-channel TFT is intrinsic or contains an impurity element for imparting p-type conductivity at the concentration of $1\times10^{15}/cm^3$ or lower;
channel regions of the first and third semiconductor layers of the p-channel TFT contain an impurity element for imparting n-type conductivity at the concentration of $1\times10^{15}$ to $1\times10^{17}/cm^3$;
a channel region of the second semiconductor layer of the p-channel TFT is formed of an intrinsic semiconductor or a semiconductor which contains an impurity element for imparting n-type conductivity at the concentration of $1\times10^{15}/cm^3$ or lower.

5. A semiconductor device according to claim 4, wherein the first gate electrode and the second gate electrode are formed of an alloy or a compound composed of one kind or plural kinds of elements selected from the group consisting of tungsten (W), molybdenum (Mo), tantalum (Ta), and titanium (Ti).

6. A semiconductor device according to claim 4, wherein the semiconductor device is implemented in an electronic apparatus selected from the group consisting of a personal computer, a video camera, a mobile computer, a player using a record medium recorded with programs, a digital camera, a front type projector, a rear type projector, a portable telephone, a portable book and a display.

7. A semiconductor device comprising:
a first gate electrode formed on an insulating surface;
a first gate insulating film formed on the first gate electrode;
a first semiconductor layer formed on the first gate insulating film;
a second semiconductor layer formed on the first semiconductor layer;
a third semiconductor layer formed on the second semiconductor layer;
a second gate insulating film formed on the third semiconductor layer; and
a second gate electrode formed on the second gate insulating film,
wherein:
channel regions of the first and third semiconductor layers contain an impurity element for imparting the same conductivity at the concentration of $1\times10^{15}$ to $1\times10^{17}/cm^3$;
a channel region of the second semiconductor layer is formed of an intrinsic semiconductor; and
the first semiconductor layer, the second semiconductor layer, and the third semiconductor layer each have a source region or a drain region which contains an impurity element for imparting different conductivity type from that of the impurity added to the channel region, at the concentration of $1\times10^{19}$ to $1\times10^{21}/cm^3$.

8. A semiconductor device according to claim 7, wherein the first gate electrode and the second gate electrode are formed of an alloy or a compound composed of one kind or plural kinds of elements selected from the group consisting of tungsten (W), molybdenum (Mo), tantalum (Ta), and titanium (Ti).

9. A semiconductor device according to claim 7, wherein the semiconductor device is implemented in an electronic apparatus selected from the group consisting of a personal computer, a video camera, a mobile computer, a player using a record medium recorded with programs, a digital camera, a front type projector, a rear type projector, a portable telephone, a portable book and a display.

10. A semiconductor device comprising an n-channel TFT and a p-channel TFT on the same substrate,
wherein:
the n-channel TFT and the p-channel TFT each have a first gate electrode formed on an insulating surface, a first gate insulating film formed on the first gate electrode, a first semiconductor layer formed on the first gate insulating film, a second semiconductor layer formed on the first semiconductor layer, a third semiconductor layer formed on the second semiconductor layer, a second gate insulating film formed on the third semiconductor layer, and a second gate electrode formed on the second gate insulating film;
channel regions of the first and third semiconductor layers of the n-channel TFT contain an impurity element for imparting p-type conductivity at the concentration of $1\times10^{15}$ to $1\times10^{17}/cm^3$;
a channel region of the second semiconductor layer of the n-channel TFT is an intrinsic semiconductor or a semiconductor which contains an impurity element for imparting p-type conductivity at the concentration of $1\times10^{15}/cm^3$ or lower;
the first semiconductor layer, the second semiconductor layer, and the third conductor layer of the n-channel TFT each include a source region or a drain region in which an impurity element for imparting n-type conductivity is added at the concentration of $1\times10^{19}$ to $1\times10^{21}/cm^3$;
channel regions of the first and third semiconductor layers of the p-channel TFT contain an impurity element for imparting n-type conductivity at the concentration of $1\times10^{15}$ to $1\times10^{17}/cm^3$;
a channel region of the second semiconductor layer of the p-channel TFT is an intrinsic semiconductor or a semiconductor which contains an impurity element for imparting n-type conductivity at the concentration of $1\times10^{15}/cm^3$ or lower; and the first semiconductor layer, the second semiconductor layer, and the third conductor layer of the p-channel TFT each include a source region or a drain region which contains an impurity element for imparting p-type conductivity at the concentration of $1\times10^{19}$ to $1\times10^{21}/cm^3$.

11. A semiconductor device according to claim 4, wherein the first gate electrode and the second gate electrode are formed of an alloy or a compound composed of one kind or plural kinds of elements selected from the group consisting of tungsten (W), molybdenum (Mo), tantalum (Ta), and titanium (Ti).

12. A semiconductor device according to claim 10, wherein the semiconductor device is implemented in an electronic apparatus selected from the group consisting of a personal computer, a video camera, a mobile computer, a player using a record medium recorded with programs, a digital camera, a front type projector, a rear type projector, a portable telephone, a portable book and a display.

13. A semiconductor device comprising an n-channel TFT and a p-channel TFT on the same substrate, wherein:
- the n-channel TFT and the p-channel TFT each have a first gate electrode formed on an insulating surface, a first gate insulating film formed on the first gate electrode, a first semiconductor layer formed on the first gate insulating film, a second semiconductor layer formed on the first semiconductor layer, a third semiconductor layer formed on the second semiconductor layer, a second gate insulating film formed on the third semiconductor layer, and a second gate electrode formed on the second gate insulating film;
- channel regions of the first and third semiconductor layers of the n-channel TFT contain an impurity element for imparting p-type conductivity at the concentration of $1\times10^{15}$ to $1\times10^{17}/cm^3$;
- a channel region of the second semiconductor layer of the n-channel TFT is an intrinsic semiconductor or a semiconductor which contains an impurity element for imparting p-type conductivity at the concentration of $1\times10^{15}/cm^3$ or lower;
- the first semiconductor layer, the second semiconductor layer, and the third conductor layer of the n-channel TFT each include a low concentration impurity region in which an impurity element for imparting n-type conductivity is added at the concentration of $1\times10^{18}$ to $1\times10^{20}/cm^3$, and a source region or a drain region in which an impurity element for imparting n-type conductivity is added at the concentration of $1\times10^{19}$ to $1\times10^{21}/cm^3$;
- channel regions of the first and third semiconductor layers of the p-channel TFT contain an impurity element for imparting n-type conductivity at the concentration of $1\times10^{15}$ to $1\times10^{17}/cm^3$;
- a channel region of the second semiconductor layer of the p-channel TFT is an intrinsic semiconductor or a semiconductor which contains an impurity element for imparting p-type conductivity at the concentration of $1\times10^{15}/cm^3$ or lower; and
- the first semiconductor layer, the second semiconductor layer, and the third conductor layer of the p-channel TFT each include a low concentration impurity region which contains an impurity element for imparting p-type conductivity at the concentration of $1\times10^{18}$ to $1\times10^{20}/cm^3$, and a source or a drain region which contains an impurity element for imparting p-type conductivity at the concentration of $1\times10^{19}$ to $1\times10^{20}/cm^3$.

14. A semiconductor device as claimed in claim 13, wherein the first gate electrode overlaps the low concentration impurity region through the first gate insulating film.

15. A semiconductor device as claimed in claim 13, wherein the second gate electrode overlaps the low concentration impurity region through the second gate insulating film.

16. A semiconductor device according to claim 5, wherein the first gate electrode and the second gate electrode are formed of an alloy or a compound composed of one kind or plural kinds of elements selected from the group consisting of tungsten (W), molybdenum (Mo), tantalum (Ta), and titanium (Ti).

17. A semiconductor device according to claim 13, wherein the semiconductor device is implemented in an electronic apparatus selected from the group consisting of a personal computer, a video camera, a mobile computer, a player using a record medium recorded with programs, a digital camera, a front type projector, a rear type projector, a portable telephone, a portable book and a display.

* * * * *